United States Patent
Lim et al.

(10) Patent No.: US 7,432,183 B2
(45) Date of Patent: Oct. 7, 2008

(54) METHODS OF MANUFACTURING A THIN FILM INCLUDING ZIRCONIUM TITANIUM OXIDE AND METHODS OF MANUFACTURING A GATE STRUCTURE, A CAPACITOR AND A FLASH MEMORY DEVICE INCLUDING THE SAME

(75) Inventors: Jae-Soon Lim, Seoul (KR); Kyu-Ho Cho, Gyeonggi-do (KR); Han-Jin Lim, Seoul (KR); Jin-Il Lee, Gyeonggi-do (KR); Ki-Chul Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 346 days.

(21) Appl. No.: 11/303,134

(22) Filed: Dec. 16, 2005

(65) Prior Publication Data

US 2006/0134849 A1 Jun. 22, 2006

(30) Foreign Application Priority Data

Dec. 20, 2004 (KR) ............... 10-2004-0108627

(51) Int. Cl.
*H01L 21/3205* (2006.01)
(52) U.S. Cl. ............ 438/591; 438/785; 257/E21.192
(58) Field of Classification Search ............ 438/591, 438/656, 685; 257/E21.192
See application file for complete search history.

(56) References Cited

U.S. PATENT DOCUMENTS

| | | | | |
|---|---|---|---|---|
| 5,572,052 A | * | 11/1996 | Kashihara et al. | 257/295 |
| 6,316,797 B1 | * | 11/2001 | Van Buskirk et al. | 257/295 |
| 6,642,573 B1 | * | 11/2003 | Halliyal et al. | 257/316 |
| 6,831,315 B2 | * | 12/2004 | Raaijmakers et al. | 257/296 |
| 2003/0031793 A1 | * | 2/2003 | Chang et al. | 427/255.28 |
| 2003/0048666 A1 | | 3/2003 | Eldridge et al. | |
| 2003/0200916 A1 | * | 10/2003 | Hase | 117/89 |
| 2004/0053472 A1 | | 3/2004 | Kiryu | |

FOREIGN PATENT DOCUMENTS

| | | |
|---|---|---|
| JP | 6-338599 A | 12/1994 |
| KR | 2002-0094933 A | 12/2002 |
| KR | 2003-51654 | 6/2003 |
| KR | 10-2004-0062243 A | 7/2004 |
| KR | 10-2004-0070481 A | 8/2004 |

* cited by examiner

*Primary Examiner*—Trung Dang
(74) *Attorney, Agent, or Firm*—Myers Bigel Sibley & Sajovec, PA

(57) ABSTRACT

A method of forming a thin film including zirconium titanium oxide including introducing a reactant including a mixture of a zirconium precursor and a titanium precursor onto a substrate, and introducing an oxidizing agent onto the substrate to form a solid material including zirconium titanium oxide on the substrate is provided. The thin film may be applied to a gate insulation layer of the gate structure, a dielectric layer of the capacitor or a flash memory device, and methods of forming the same are provided.

34 Claims, 15 Drawing Sheets

METHODS OF MANUFACTURING A THIN FILM INCLUDING ZIRCONIUM TITANIUM OXIDE AND METHODS OF MANUFACTURING A GATE STRUCTURE, A CAPACITOR AND A FLASH MEMORY DEVICE INCLUDING THE SAME

CROSS-REFERENCE TO RELATED APPLICATION

This application claims priority under 35 USC § 119 to Korean Patent Application No. 10-2004-108627, filed on Dec. 20, 2004, the disclosure of which is hereby incorporated by reference in its entirety.

FIELD OF THE INVENTION

The present invention relates to methods of manufacturing a thin film using zirconium and titanium precursors and methods of manufacturing a gate structure, a capacitor and a flash memory device including the same.

BACKGROUND OF THE INVENTION

Materials having a high dielectric constant (k) may be used for a thin film in a semiconductor device such as a gate insulation layer of a MOS transistor, a dielectric layer of a capacitor or a dielectric layer flash memory device. The thin film including a high-k material may have a thin equivalent oxide thickness (EOT) and/or may reduce the leakage current between a gate electrode and a channel, or between a lower electrode and an upper electrode. The thin film may also improve the coupling ratio of the flash memory device.

Examples of a high-k material may include tantalum oxide ($Ta_2O_5$), yttrium oxide ($Y_2O_3$), hafnium oxide ($HfO_2$), zirconium oxide ($ZrO_2$), niobium oxide ($Nb_2O_5$), barium titanium oxide ($BaTiO_3$), strontium titanium oxide ($SrTiO_3$) and the like. Hafnium oxide ($HfO_2$) has been used as a material for forming a thin film having a high dielectric constant. For example, U.S. Pat. No. 6,348,386 to Gilmer discusses a method of forming a thin film using hafnium oxide ($HfO_2$). However, since the dielectric constant of a hafnium oxide layer is about 20, the hafnium oxide layer may be less desirable for manufacturing a semiconductor device that requires a dielectric constant greater than 20.

Accordingly, a thin film including zirconium oxide instead of hafnium oxide has been employed. The zirconium oxide layer has a dielectric constant of about 30 and a decreased equivalent oxide thickness. A method of forming a thin film including zirconium oxide is discussed in U.S. Patent Application Publication No. 2004/0033698 and U.S. Patent Application Publication No. 2002/0190294. However, since the dielectric constant of the zirconium oxide layer is about 30, the zirconium oxide layer may not be suitable during fabrication of a semiconductor device that requires a dielectric constant of over 30. Thus, a thin film including titanium oxide and having a dielectric constant of about 60 has been employed for fabrication of highly integrated semiconductor devices. However, titanium oxide may have a relatively lower bonding energy than hafnium oxide or zirconium oxide so that the titanium oxide layer may have undesirable leakage current characteristics.

To address some of the foregoing issues, a thin film including zirconium titanium oxide (i.e., simultaneously including titanium oxide and zirconium oxide) has been developed. The thin film including zirconium titanium oxide may exhibit desirable leakage current characteristics in comparison with a conventional titanium oxide layer and/or may possess a relatively higher dielectric constant that is the same as, or similar to, that of a conventional titanium oxide layer.

A method of forming a thin film including zirconium titanium oxide is discussed in U.S. Patent Application Publication No. 2002/0190294 and Korean Laid-Open Patent Publication No. 2004-062243. Specifically, a method of forming a thin film using $ZrCl_4$ as a zirconium source and $TiCl_4$ as a titanium source is discussed in U.S. Patent Application Publication No. 2002/0190294. A method of forming a gate insulation layer having a multi-layered structure that includes a first film of zirconium oxide and a second film of titanium oxide is discussed in Korean Laid-Open Patent Publication No. 2004-062243. However, a thin film having a single layer structure that includes zirconium titanium oxide and a method of forming this thin film are not discussed in U.S. Patent Application Publication No. 2002/0190294 or Korean Laid-Open Patent Publication No. 2004-062243.

SUMMARY OF THE INVENTION

Embodiments of the present invention provide methods of forming a thin film including introducing a reactant including a mixture of a zirconium precursor and a titanium precursor onto a substrate, and introducing an oxidizing agent onto the substrate to form a solid material including zirconium titanium oxide on the substrate. In some embodiments, the thin film including zirconium titanium oxide has a single layer structure. In some embodiments of the present invention, the zirconium precursor may include zirconium butoxide ($Zr(OtBu)_4$), tetrakis ethylmethylamino zirconium (TEMAZ; $Zr[N(CH_3)(C_2H_5)_4]$), zirconium ethoxide ($Zr(OEt)_4$), zirconium iso-propoxide ($Zr(OC_3H_7)_4$), tetramethyl heptanedionato zirconium ($Zr[TMHD]_4$, $Zr(C_{11}H_{19}O_2)_4$) or a combination thereof. In some embodiments of the present invention, the titanium precursor may include titanium butoxide ($Ti(OtBu)_4$), tetrakis ethylmethylamino titanium (TEMAT; $Ti[N(CH_3)(C_2H_5)_4]$), titanium ethoxide ($Ti(OEt)_4$), titanium iso-propoxide ($Ti(OC_3H_7)_4$), tetramethyl heptanedionato titanium ($Ti[TMHD]_2$; $Ti(C_{11}H_{19}O_2)_2$), or a combination thereof. In some embodiments of the present invention, the oxidizing agent may include an ozone ($O_3$) gas, an oxygen ($O_2$) gas, water vapor ($H_2O$), an oxygen ($O_2$) plasma, a remote oxygen ($O_2$) plasma, etc., or a combination thereof.

In further embodiments of the present invention, there is provided a method of manufacturing a gate structure in a semiconductor device. A substrate may be loaded into a chamber. An oxidizing agent and a reactant including a zirconium precursor and a titanium precursor may be introduced onto the substrate in the chamber to thereby form a gate insulation layer including zirconium titanium oxide on the substrate. After formation of a gate conductive layer on the gate insulation layer, the gate conductive layer and the gate insulation layer may be patterned. Thus, a gate pattern having a gate conductive layer pattern and a gate insulation layer pattern may be formed on the substrate.

According to some embodiments of the present invention, there is provided a method of manufacturing a capacitor in a semiconductor device. A lower electrode may be formed on the substrate. The substrate having the lower electrode may be loaded into a chamber. An oxidizing agent and a reactant including a zirconium precursor and a titanium precursor may be provided on the lower electrode of the substrate to thereby form a dielectric layer including zirconium titanium oxide on the lower electrode. An upper electrode may be formed on the lower electrode. The capacitor that includes the lower electrode, the dielectric layer including zirconium titanium oxide and the upper electrode may then be formed on the substrate.

In some embodiments of the present invention, there is provided a method of manufacturing a flash memory device. A tunnel oxide layer may be formed on a substrate and a floating gate may be formed on the tunnel oxide layer. The substrate having the floating gate and the tunnel oxide layer may be loaded into a chamber, and an oxidizing agent and a reactant including a zirconium precursor and a titanium precursor may then be introduced onto the floating gate of the substrate to form a dielectric layer including zirconium titanium oxide on the floating gate. A control gate may be formed on the dielectric layer. Thus, a gate structure that includes the tunnel oxide layer, the floating gate, the dielectric layer having zirconium titanium oxide and the control gate is formed on the substrate.

According to some embodiments of the present invention, the thin film may have a relatively high dielectric constant and/or a reduced leakage current. Thus, a thin film according to some embodiments of the present invention may be desirable in the manufacture of gate insulation layers, dielectric layers of a capacitor or flash memory devices.

DETAILED DESCRIPTION

Figure 1A:
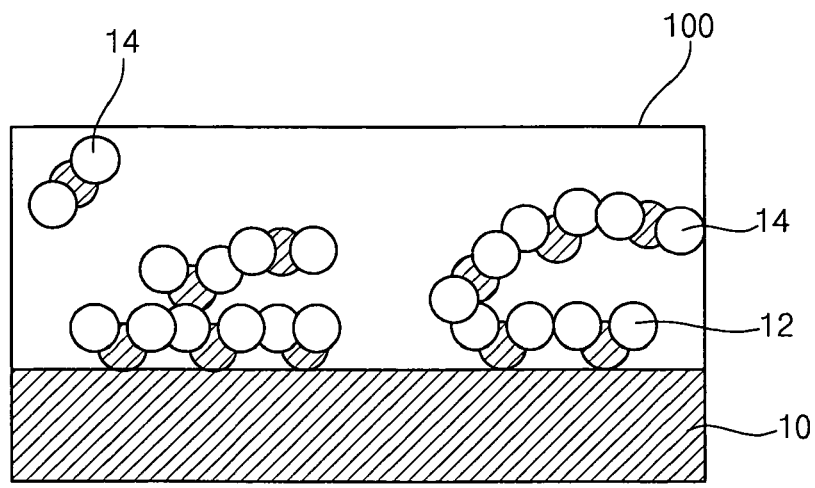
FIGS. 1A to 1E are cross-sectional views illustrating method embodiments of manufacturing a thin film according to some embodiments of the present invention.

The present invention will now be described more fully hereinafter with reference to the accompanying drawings, in which embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art. The terminology used in the description of the invention herein is for the purpose of describing particular embodiments only and is not intended to be limiting of the invention. As used in the description of the embodiments of the invention and the appended claims, the singular forms "a", "an" and "the" are intended to include the plural forms as well, unless the context clearly indicates otherwise. Also, as used herein, "and/or" refers to and encompasses any and all possible combinations of one or more of the associated listed items. Unless otherwise defined, all terms, including technical and scientific terms used in this description, have the same meaning as commonly understood by one of ordinary skill in the art to which this invention belongs. All publications, patent applications, patents, and other references mentioned herein are incorporated by reference in their entirety.

It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof.

Moreover, it will be understood that steps comprising the methods provided herein can be performed independently or at least two steps can be combined. Additionally, steps comprising the methods provided herein, when performed independently or combined, can be performed at the same temperature and/or atmospheric pressure or at different temperatures and/or atmospheric pressures without departing from the teachings of the present invention.

In the drawings, the thickness of layers and regions are exaggerated for clarity. It will also be understood that when a layer is referred to as being "on" another layer or substrate or a reactant is referred to as being introduced, exposed or feed "onto" another layer or substrate, it can be directly on the other layer or substrate, or intervening layers can also be present. However, when a layer, region or reactant is described as being "directly on" or introduced, exposed or feed "directly onto" another layer or region, no intervening layers or regions are present. Additionally, like numbers refer to like compositions or elements throughout.

Embodiments of the present invention are further described herein with reference to cross-section illustrations that are schematic illustrations of idealized embodiments of the present invention. As such, variations from the shapes of the illustrations as a result, for example, of manufacturing techniques and/or tolerances, are to be expected. In particular, the regions illustrated in the figures are schematic in nature and their shapes are not intended to illustrate the precise shape of a region of a device and are not intended to limit the scope of the present invention.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

As will be appreciated by one of ordinary skill in the art, the present invention may be embodied as compositions and devices including the compositions as well as methods of making and using such compositions and devices.

FIGS. 1A to 1E are cross-sectional views illustrating method embodiments of manufacturing a thin film in accordance with some embodiments of the present invention. Referring to FIG. 1A, a substrate 10 is loaded into a chamber 100. The reactivity of a reactant used in forming the thin film may decrease when the chamber 100 has a temperature of less than about 250° C. Components included in the thin film formed on the substrate 10 may be crystallized when the chamber 100 has a temperature of more than about 500° C. In some embodiments of the present invention, the chamber 100 may have a temperature in a range of about 250° C. to about 500° C. In other embodiments of the present invention, the chamber 100 may have a temperature in a range of about 250° C. to about 400° C. In still other embodiments of the present invention, the chamber 100 may have a temperature in a range of about 300° C. to about 350° C. In some embodiments, the chamber 100 has a temperature of about 300° C.

The reactivity of the reactant may decrease when the chamber 100 has a pressure of less than about 0.01 torr. A process for forming the thin film may be less controllable when the chamber 100 has a pressure of more than about 10.0 torr. In some embodiments of the present invention, the chamber 100 may have a pressure in a range of about 0.01 torr to about 10.0 torr. In other embodiments of the present invention, the chamber 100 may have a pressure in a range of about 0.05 torr to about 5.0 torr. In still other embodiments of the present invention, the chamber 100 may have a pressure in a range of about 0.1 torr to about 3.0 torr. The substrate 10 may be loaded into the chamber 100 having the above-mentioned temperature and pressure.

The reactant including a mixture of a zirconium precursor and a titanium precursor may be introduced into the chamber 100. Examples of the zirconium precursor include suitable compounds including zirconium such as zirconium butoxide ($Zr(OtBu)_4$), tetrakis ethylmethylamino zirconium (TEMAZ; $Zr[N(CH_3)(C_2H_5)_4]$), zirconium ethoxide ($Zr(OEt)_4$), zirconium iso-propoxide ($Zr(OC_3H_7)_4$), tetramethyl heptanedionato zirconium ($Zr[TMHD]_4$; $Zr(C_{11}H_{19}O_2)_4$), etc., alone or in a mixture thereof.

Examples of the titanium precursor include suitable compounds including titanium such as titanium butoxide ($Ti(OtBu)_4$), tetrakis ethylmethylamino titanium (TEMAT; $Ti[N(CH_3)(C_2H_5)_4]$), titanium ethoxide ($Ti(OEt)_4$), titanium iso-propoxide ($Ti(OC_3H_7)_4$), tetramethyl heptanedionato titanium ($Ti[TMHD]_2$; $Ti(C_{11}H_{19}O_2)_2$), etc., alone or in a mixture thereof.

The zirconium precursor and the titanium precursor are included in the reactant with a flow rate ratio in a range of about 1.0:0.1 to about 1.0:9.0. In some embodiments, the reactant includes the zirconium precursor and the titanium precursor at a flow rate ratio of about 1.0:1.0.

The reactant including the zirconium and titanium precursors may be introduced onto the substrate 10 using a liquid delivery system (LDS). In some embodiments of the present invention, the reactant may be introduced onto the substrate 10 for a period of time in a range from about 0.5 to 5 seconds.

A first portion 12 of the reactant may be chemisorbed onto the substrate 10. A second portion 14 of the reactant that is not chemisorbed onto the substrate 10 is physisorbed onto the first portion 12 or is drifted in the chamber 100.

Figure 1B:
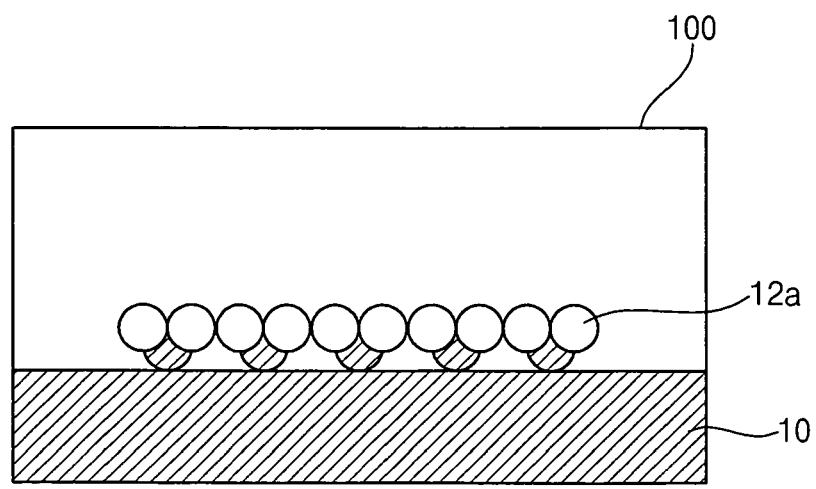

Referring to FIG. 1B, a first purge gas may be introduced into the chamber 100. The first purge gas may include an inactive or inert gas such as an argon (Ar) gas, a nitride ($N_2$) gas, neon (Ne), etc. The first purge gas may be introduced into the chamber 100 for a period of time in a range about 1 to about 30 seconds. In some embodiments, the first purge gas is introduced into the chamber 100 for about 30 seconds. The second portion 14 of the reactant that is physisorbed onto the first portion 12 or drifted in the chamber 100 may be removed by introducing the first purge gas into the chamber 100. Thus, the first portion 12 of the reactant that is chemisorbed onto the substrate 10 may remain on the substrate 10, and the remaining first portion 12 of the reactant may be referred to as precursor molecules 12a.

In some embodiments of the present invention, the chamber 100 may be subject to a vacuum for period of time in a range from 1 to 30 seconds to remove at least a portion, if not all, of the second portion 14 of the reactant.

In other embodiments of the present invention, introducing the first purge gas and subjecting the chamber 100 to a vacuum may be carried out simultaneously so as to remove the second portion 14 of the reactant.

Figure 1C:
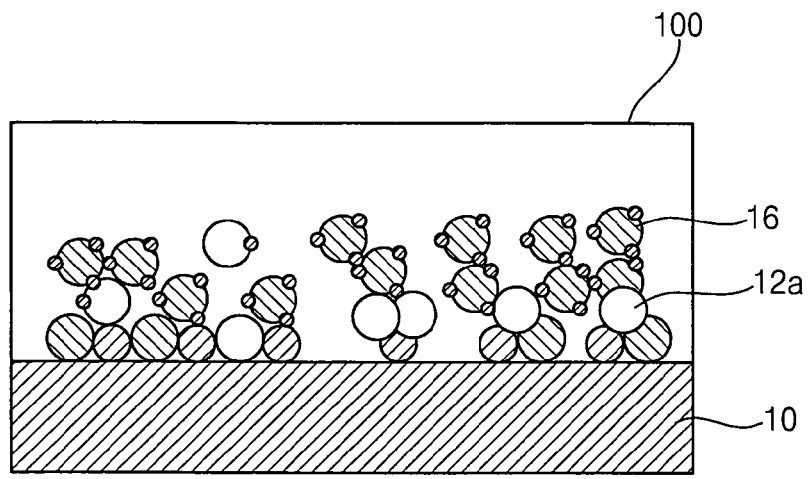

Referring to FIG. 1C, an oxidizing agent 16 may be introduced into the chamber 100. The oxidizing agent 16 may include an ozone ($O_3$) gas, an oxygen ($O_2$) gas, water vapor ($H_2O$), an oxygen ($O_2$) plasma, a remote oxygen ($O_2$) plasma, etc., alone or in a mixture thereof. In some embodiments of the present invention, the oxidizing agent 16 may be introduced onto the substrate 10 for a period of time in a range of about 0.5 to about 5 seconds. In some embodiments, oxidizing agent 16 comprises ozone ($O_3$) gas and may be introduced onto the substrate 10 for a period of time in a range from about 2 seconds. In further embodiments, the oxidizing agent 16 may be chemically reacted with the precursor molecules 12a, i.e., the first portion 12 of the reactant may be chemisorbed on the substrate 10, so that the precursor molecules 12a are oxidized.

Figure 1D:
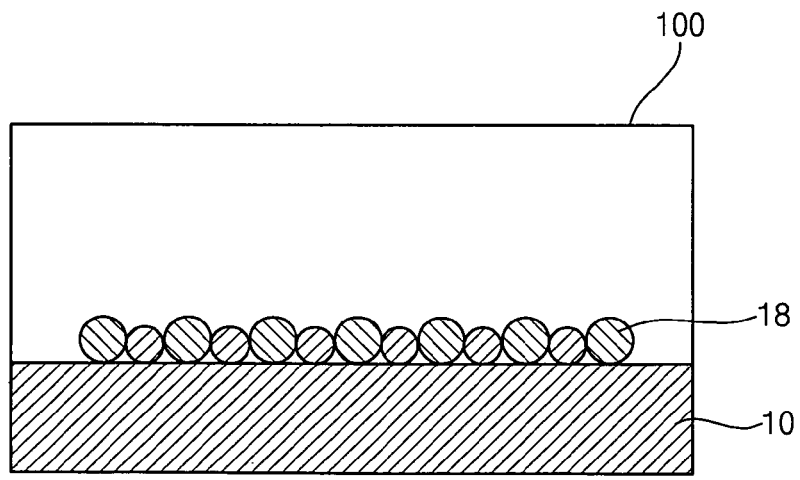

Referring to FIG. 1D, a second purge gas may be introduced into the chamber 100. Examples of the second purge gas may include an inert gas such as an argon (Ar) gas, a nitrogen ($N_2$) gas, a neon (Ne) gas, etc. In some embodiments of the present invention, the second purge gas may be introduced into the chamber 100 for a period of time in a range from about 1 to about 30 seconds. The oxidizing agent 16 that is not reacted with the precursor molecules 12a may be removed from the chamber 100 by introducing the second purge gas into the chamber 100. Consequently, a solid material 18 may be formed on the substrate 10. The solid material 18 may include zirconium titanium oxide.

Figure 1E:
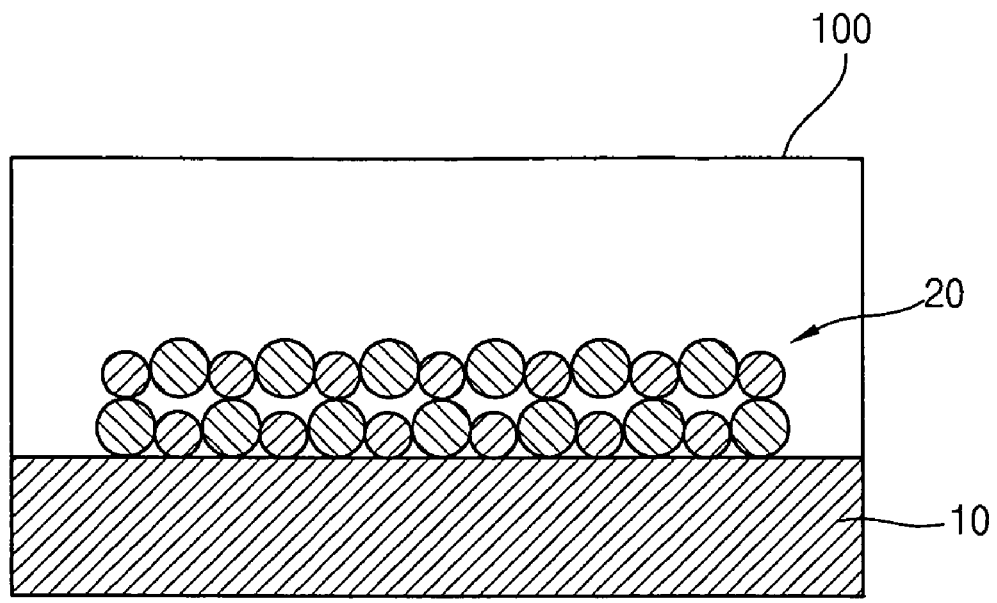

Referring to FIG. 1E, introducing the reactant including the zirconium precursor and the titanium precursor, introducing the first purge gas, introducing the oxidizing agent and introducing the second purge gas may be repeated sequentially at least once, and some steps may be combined. As a result, a thin film 20 including a plurality of solid materials 18 is formed on the substrate 10. The thin film 20 includes zirconium titanium oxide. The thin film 20 may have a desired thickness by adjusting the number of cycles including the above-described processes.

The thin film 20 may be formed using a reactant that includes a zirconium precursor and titanium precursor so that the thin film 20 includes zirconium titanium oxide and has a single layer structure. Therefore, the thin film 20 may have a relatively high dielectric constant due, at least in part, to titanium oxide and the leakage current generated through the thin film 20 may be greatly reduced due to zirconium oxide.

Figure 2A:
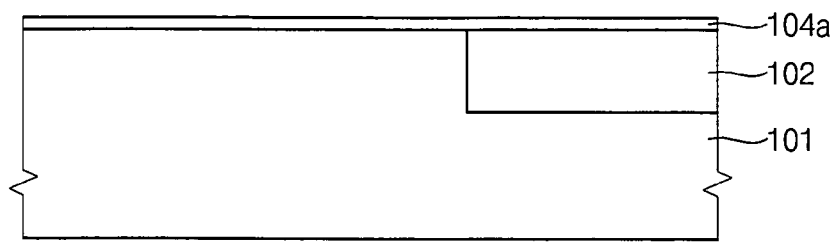
FIGS. 2A to 2H are cross-sectional views illustrating method embodiments of manufacturing a gate structure and a capacitor in a semiconductor device according to some embodiments of the present invention.

FIGS. 2A to 2H are cross-sectional views illustrating method embodiments of manufacturing a gate structure and a capacitor in a semiconductor device in accordance with the present invention. Referring to FIG. 2A, an isolation layer may be formed at an upper portion of a substrate 101 by a shallow trench isolation (STI) process to define an active region and a field region 102. The substrate 101 may include a silicon substrate, a silicon-on-insulator (SOI) substrate, etc. A gate insulation layer 104a may be formed on the substrate 101. The gate insulation layer 104a may have a decreased thin equivalent oxide thickness (EOT) and the leakage current between the gate electrode and a channel may be reduced. In some example embodiments of the present invention, the gate insulation layer 104a may be formed in a single-layered structure including zirconium titanium oxide.

Processes for manufacturing the thin film including zirconium titanium oxide in the single layer structure are the same as, or similar to, those described with reference to FIGS. 1A to 1C, except that the gate insulation layer 104a may have a thickness in a range of about 20 Å to 150 Å. Thus, processes the same as, or similar to, those described with reference to FIGS. 1A to 1C may be carried out at least once. In some embodiments, the gate insulation layer 104a may have a thickness of about 50 Å and may be formed on the single layer structure, which includes zirconium titanium oxide.

Figure 2B:
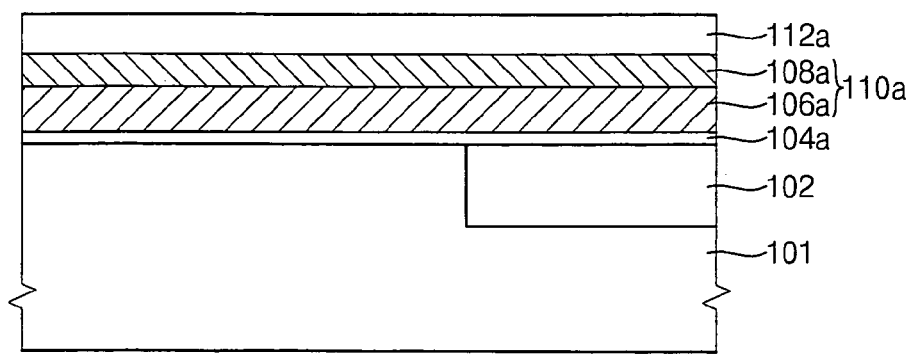

Referring to FIG. 2B, a gate conductive layer 110a may be formed on the gate insulation layer 104a. In some embodiments of the present invention, the gate conductive layer 110a may be formed to provide a double layer structure including a polysilicon layer 106a and a metal silicide layer 108a such as a tungsten suicide layer. In addition, in some embodiments of the present invention, a capping insulation layer 112a including silicon oxide may be formed on the gate conductive layer 110a.

Figure 2C:
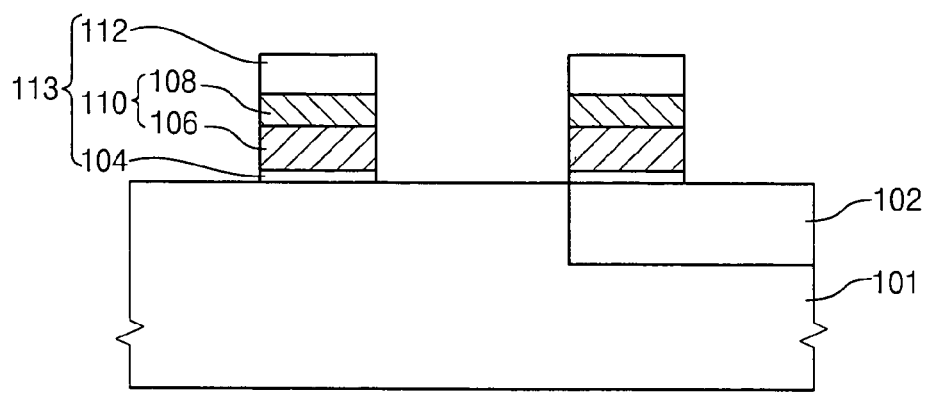

Referring to FIG. 2C, the capping insulation layer 112a, the gate conductive layer 110a and the gate insulation layer 104a may be patterned by a photolithography process to form a gate structure 113 on the substrate 101. The gate structure 113 includes a capping insulation layer pattern 112, a gate conductive layer pattern 110 and a gate insulation layer pattern 104. In some embodiments, the gate conductive layer pattern 110 includes a polysilicon layer pattern 106 and a metal silicide layer pattern 108.

Figure 2D:
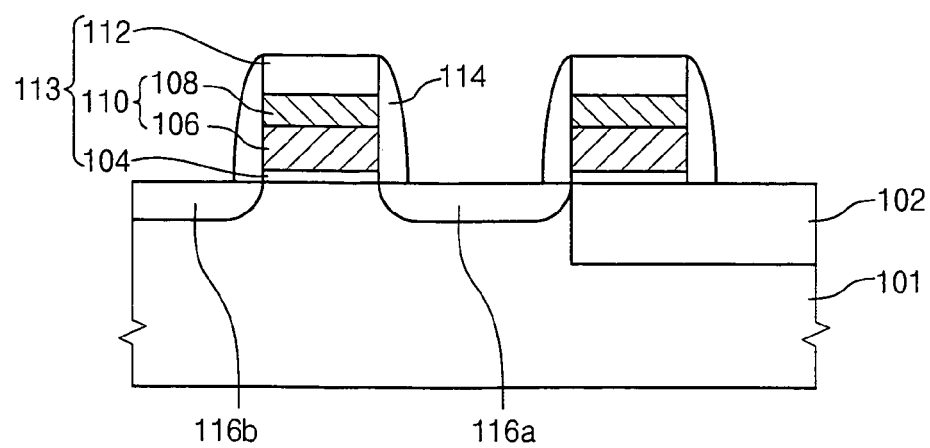

Referring to FIG. 2D, a sidewall spacer 114 including silicon nitride may be formed on a sidewall of the gate structure 113. Impurities may be implanted into surface portions of the substrate 101 by an ion implantation process to form a source region 116a and a drain region 116b. In some embodiments of the present invention, the ion implantation process may be executed before formation of the sidewall spacer 114. In other embodiments of the present invention, the ion implantation process may be executed after forming the sidewall spacer 114.

Figure 2E:
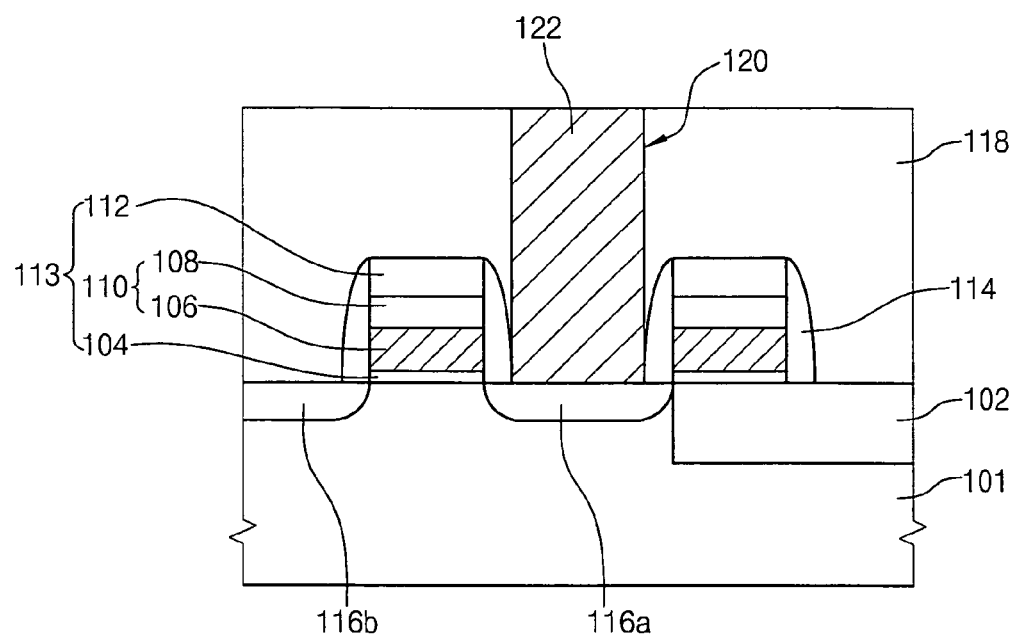

Referring to FIG. 2E, a first insulation layer may be formed on the substrate 101 having the gate structure 113. The first insulation layer may include an insulation material such as an oxide. The first insulation layer may be patterned by a photolithography process to form a first insulation layer pattern 118. The first insulation layer pattern 118 may include a first contact hole 120 exposing the source region 116a. A first conductive layer including polysilicon may be formed on the first insulation layer pattern 118 to cover the first contact hole 120. The first conductive layer may be at least partially removed by a suitable process known to those skilled in the art such as chemical mechanical polishing (CMP) process, an etch back process or a combination process of CMP and etch back, until the first insulation layer pattern 118 is exposed. Hence, a contact plug 122 filled with the first conductive layer may be formed in the first contact hole 120.

Figure 2F:
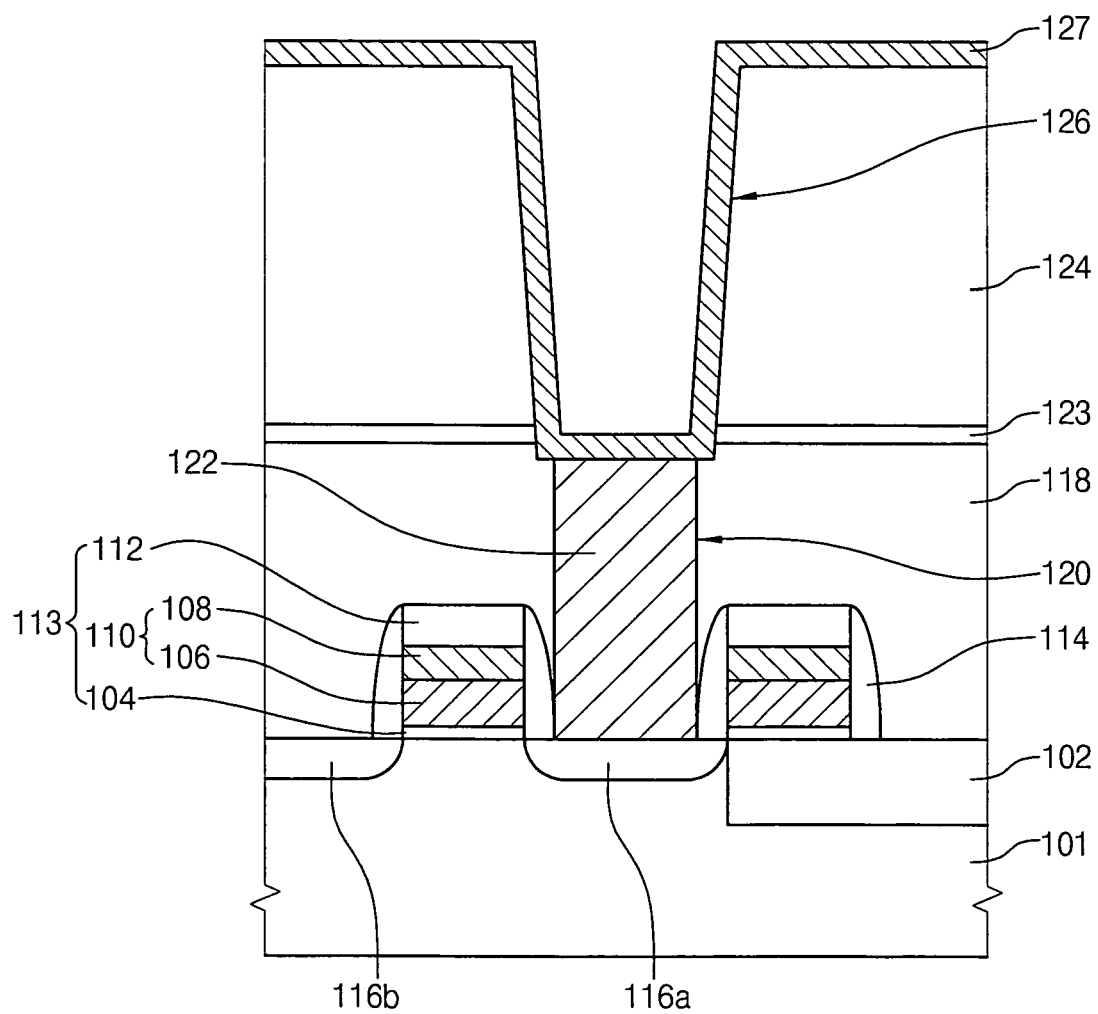

Referring to FIG. 2F, an etch stop layer 123 may be formed on the contact plug 122 and the first insulation layer pattern 118. The etch stop layer 123 may be formed as a material having a relatively high etching selectivity with respect to the first insulation layer pattern 118. In some embodiments, the etch stop layer 123 includes silicon nitride or silicon oxynitride.

A second insulation layer including an oxide may be formed on the etch stop layer 123 to be patterned by a photolithography process. Thus, a second insulation layer pattern 124 may be formed. The second insulation layer pattern 124 may include a second contact hole 126 exposing the contact plug 122. In some embodiments, the second insulation layer may be at least partially removed until the etch stop layer 123 is exposed and the etch stop layer 123 may be at least partially removed until the contact plug 122 is exposed. In some embodiments of the present invention, a sidewall of the second contact hole 126 may be formed to slope downwards so that the size of an open upper portion of the second contact hole 126 is greater than that of a lower portion of the second contact hole 126 because, at least in part, an etching rate of the lower portion is less than that of the open upper portion of the second contact hole 126 in the etching process of the second insulation layer.

A second conductive layer 127 may be formed on a surface of the second insulation layer pattern 124 and on a sidewall and lower surface of the second contact hole 126. The second conductive layer 127 may include polysilicon, a conductive metal nitride such as titanium nitride (TiN), tantalum nitride (TaN) or tungsten nitride (WN), or a metal such as ruthenium (Ru), etc., alone or in a mixture thereof.

Figure 2G:
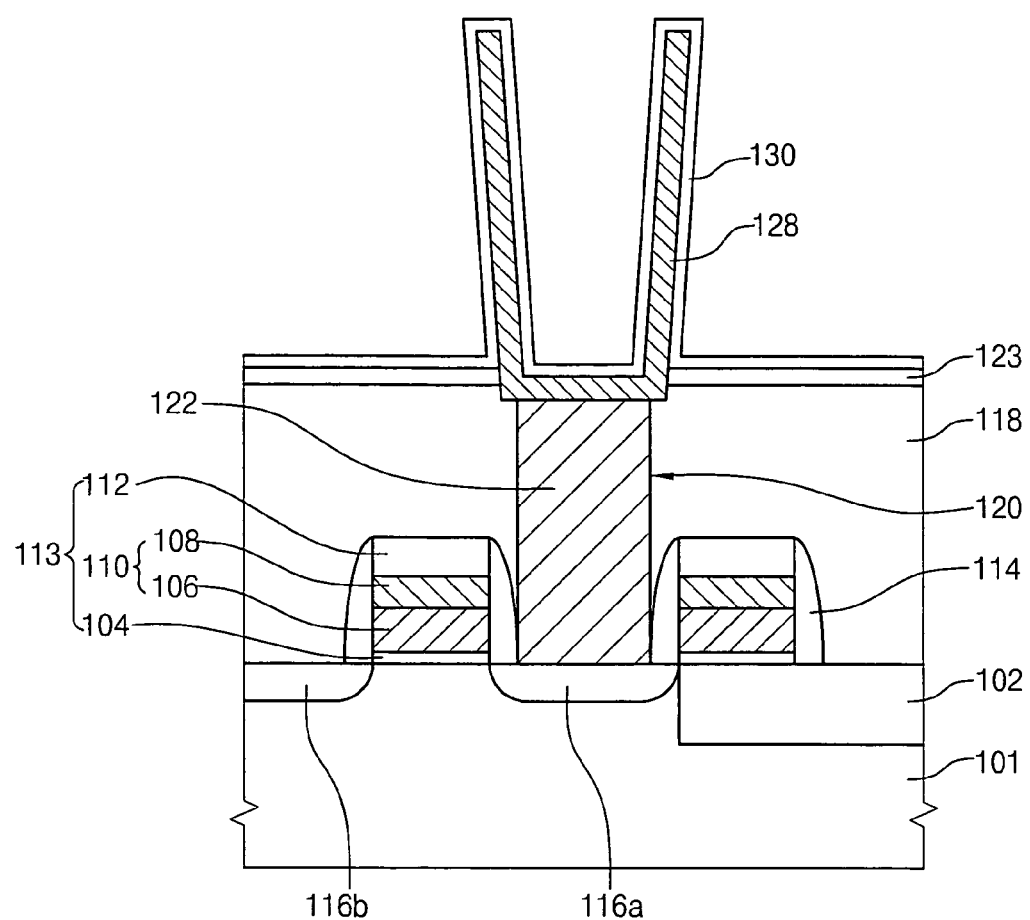

Referring to FIG. 2G, a sacrificial layer (not shown) may be formed on the second conductive layer 127 and the sacrificial layer is at least partially removed until the second conductive layer 127 on the second insulation layer pattern 124 is exposed. The second conductive layer 127 on the second insulation layer pattern 124 is at least partially removed. Thus, the second conductive layer 127 may remain on the sidewall and the lower face of the second contact hole 126.

The residual sacrificial layer in the second contact hole 126 may be removed. Thus, the second conductive layer 127 formed along an inner profile of the second contact hole 126 may remain, so that the second conductive layer 127 may be separated in a unit cell. Accordingly, a lower electrode 128 of a capacitor may be formed on a respective cell area. In some embodiments of the present invention, the lower electrode 128 may be formed in a cylindrical shape having a height in a range of about 10,000 Å to about 17,000 Å, with a relatively wide opening and relatively narrow bottom.

A dielectric layer 130 may be formed on the lower electrode 128. The dielectric layer 130 may have a decreased equivalent oxide thickness (EOT) and a relatively high dielectric constant. Additionally, the dielectric layer 130 may reduce the leakage current between the lower electrode 128 and an upper electrode. In some embodiments, the dielectric layer 130 includes zirconium titanium oxide.

Processes of manufacturing the thin film having zirconium titanium oxide in a single layer structure are the same as, or similar to, those described with reference to FIGS. 1A to 1D. In some embodiments of the present invention, the dielectric layer 130 may have a thickness in a range of about 20 Å to about 150 Å.

Thus, processes the same as, or similar to, those described with reference to FIGS. 1A to 1D may be carried out at least once. In some embodiments, a dielectric layer 130 having a thickness of about 40 Å and zirconium titanium oxide in a single-layered structure may be formed on the lower electrode 128.

In some embodiments of the present invention, the dielectric layer 130 may have a dielectric constant of more than about 30 so that a capacitor including the dielectric layer 130 has a relatively high capacitance.

Figure 2H:
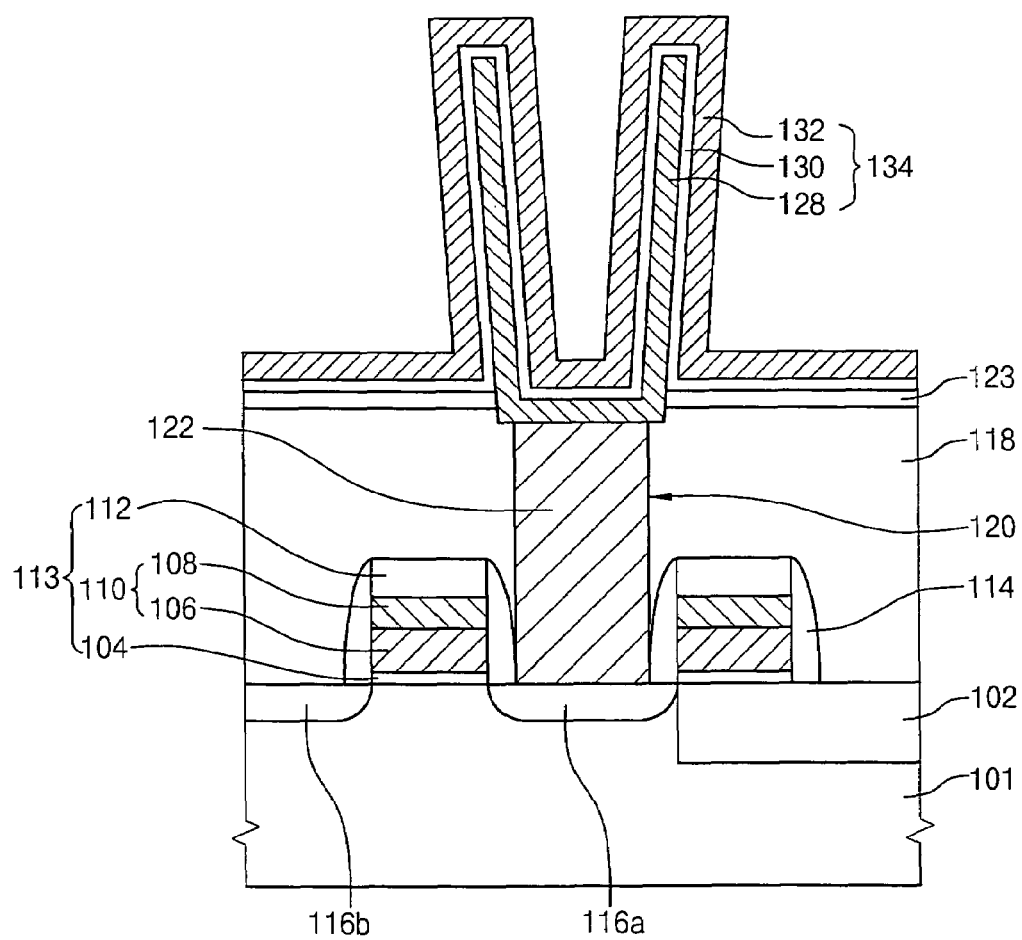

Referring to FIG. 2H, after forming the dielectric layer 130, the dielectric layer 130 may be heated so that impurities in or on the dielectric layer 130 may be removed and oxygen deficiency may be sufficiently cured. The heat treatment process may be performed using a suitable heat treatment such as an ultraviolet ray-ozone (UV-$O_3$) treatment, a plasma treatment and the like.

An upper electrode 132 may be formed on the dielectric layer 130. The upper electrode 132 may include polysilicon, a conductive metal nitride such as titanium nitride (TiN), tantalum nitride (TaN) or tungsten nitride (WN), or a metal such as ruthenium (Ru) and the like, alone or in a mixture thereof.

A capacitor 134 including the lower electrode 128, the dielectric layer 130 and the upper electrode 132 may be formed on the substrate 101.

In some embodiments of the present invention, the thin film including zirconium titanium oxide in a single-layered structure may be formed using a reactant including a zirconium precursor and a titanium precursor. The thin film may be applied to a gate insulation layer in a gate structure and a dielectric layer in a capacitor. The gate insulation layer in the gate structure and the dielectric layer in the capacitor may have a relatively high dielectric constant due to titanium oxide. Further, the leakage current may be reduced due, at least in part, to zirconium oxide.

As a result, the gate insulation layer in the gate structure and the dielectric layer in the capacitor may have a decreased equivalent oxide thickness (EOT) and a relatively high dielectric constant. Additionally, the gate insulation layer and the dielectric layer may reduce the leakage current. Therefore, the gate structure and the capacitor in accordance with some embodiments of the present invention may have improved electrical characteristics.

Figure 3A:
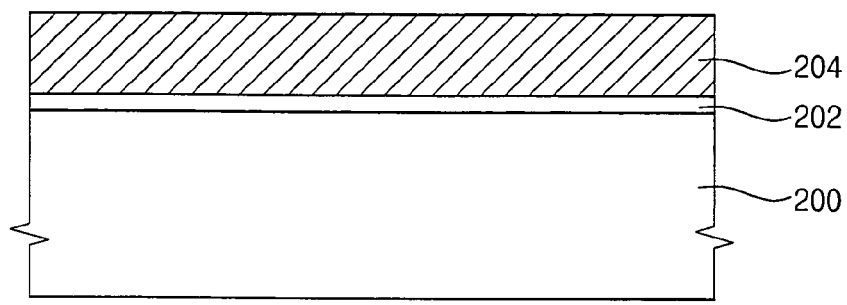
FIGS. 3A to 3D are cross-sectional views illustrating method embodiments of manufacturing a flash memory device according to embodiments of the present invention.

FIGS. 3A to 3D are cross-sectional views illustrating method embodiments of manufacturing a flash memory device in accordance with the present invention. Referring to FIG. 3A, a substrate 200 having an isolation layer (not shown) is provided. A tunnel oxide layer 202 may be formed on the substrate 200. The tunnel oxide layer 202 may be formed on the substrate 200 by an oxidation process such as a thermal oxidation process or a radical oxidation process. In some embodiments of the present invention, the tunnel oxide layer 202 may have a thickness in a range of about 10 Å to about 500 Å.

A first conductive layer 204 may be formed on the tunnel oxide layer 202. The first conductive layer 204 may include polysilicon, a conductive metal nitride such as titanium nitride (TiN), tantalum nitride (TaN) or tungsten nitride (WN), or a metal such as ruthenium (Ru) and the like, alone or in a mixture thereof.

In some embodiments of the present invention, the first conductive layer 204 may be formed by a deposition process using polysilicon and by a doping process with impurities. The deposition process may be performed by thermal decomposition of silane ($SiH_4$) gas. The impurities may be doped into the polysilicon layer by a suitable process known to those skilled in the art such a diffusion process, an ion implantation process or an in-situ doping process.

In some embodiments of the present invention, the first conductive layer 204 may be formed by a chemical vapor deposition (CVD) process using a conductive metal nitride such as titanium nitride, tantalum nitride, tungsten nitride and the like.

Figure 3B:
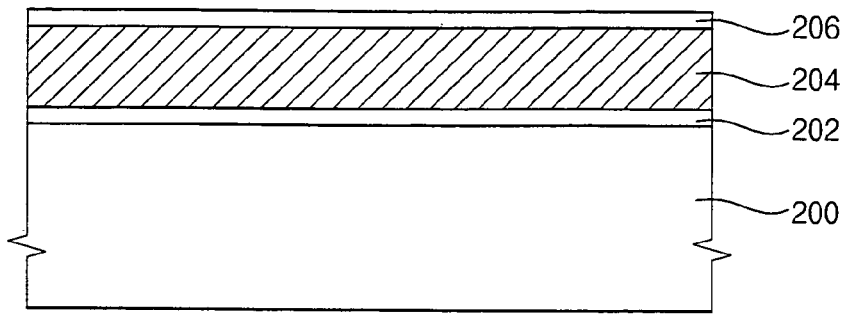

Referring to FIG. 3B, a preliminary dielectric layer 206 may be formed on the first conductive layer 204. The preliminary dielectric layer 206 may be patterned to form a dielectric layer in the flash memory device, so that the preliminary dielectric layer 206 may have a relatively high capacitance, which may improve the coupling ratio of the flash memory device. Thus, the preliminary dielectric layer 206 may be formed to have a single layer structure including zirconium titanium oxide.

Processes of manufacturing the thin film having zirconium titanium oxide in the single-layered structure are the same as, or similar to, those described with reference to FIGS. 1A to 1D. In some embodiments of the present invention, the preliminary dielectric layer 206 may have a thickness in a range of about 200 Å to about 600 Å

Thus, processes the same as, or similar to, those described with reference to FIGS. 1A to 1D may be carried out at least once. In some embodiments, the preliminary dielectric layer 206 having a thickness of about 300 Å and including zirconium titanium oxide in the single-layered structure may be formed on the first conductive layer 204.

Figure 3C:
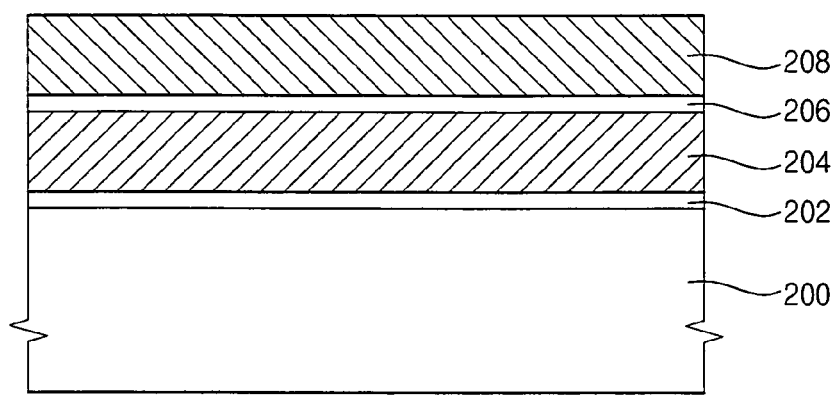

Referring to FIG. 3C, a second conductive layer 208 may be formed on the preliminary dielectric layer 206. The second conductive layer 208 may include polysilicon, a conductive metal nitride such as titanium nitride (TiN), tantalum nitride (TaN) or tungsten nitride (WN), or a metal such as ruthenium (Ru) and the like, alone or in a mixture thereof.

Figure 3D:
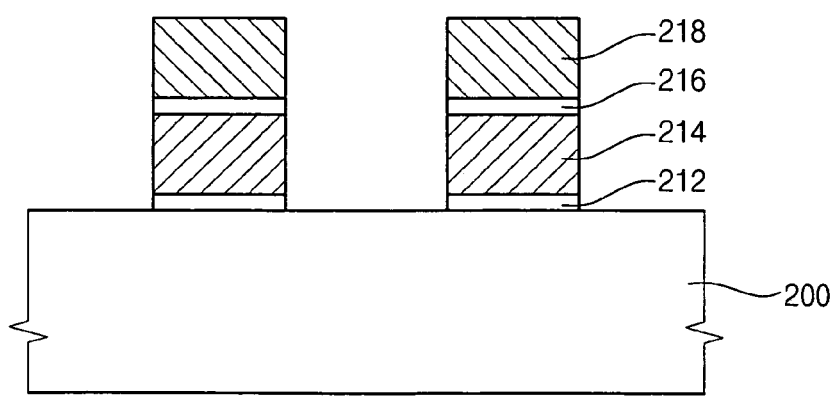

Referring to FIG. 3D, the second conductive layer 208, the preliminary dielectric layer 206, the first conductive layer 204 and the tunnel oxide layer 202 may be patterned sequentially. The second conductive layer 208 may be formed to a control gate 218, the preliminary dielectric layer 206 may be formed to a dielectric layer 216, the first conductive layer 204 may be formed to a floating gate 214 and the tunnel oxide layer 202 may be formed to a tunnel oxide layer pattern 212.

Accordingly, a gate structure of the flash memory device may be formed on the substrate 200. The gate structure may include tunnel oxide layer pattern 212, the floating gate 214, the dielectric layer 216, and the control gate 218.

In some embodiments of the present invention, the dielectric layer in the flash memory including zirconium titanium oxide may be formed using a reactant including a zirconium precursor and a titanium precursor. The dielectric layer may have a relatively high dielectric constant due, at least in part, to titanium oxide and the leakage current may be reduced due, at least in part, to zirconium oxide. The dielectric layer in the flash memory device may have a relatively high dielectric constant that may improve the coupling ratio of the flash memory device. Therefore, the flash memory device according to embodiments of the present invention may have improved electrical characteristics. Additionally, the dielectric layer including zirconium titanium oxide in the single-layered structure may be applied to a vertical-type gate structure or a pin-type gate structure in the flash memory device.

Measurement of a Dielectric Constant

In order to measure a dielectric constant of a thin film according to some embodiments of the present invention, a sample thin film including zirconium titanium oxide in a single-layered structure was prepared in accordance with an exemplary method described herein. In particular, FIG. 4 is a timing chart illustrating a process of providing materials for manufacturing the thin film in accordance with some embodiments of the present invention.

Figure 4:
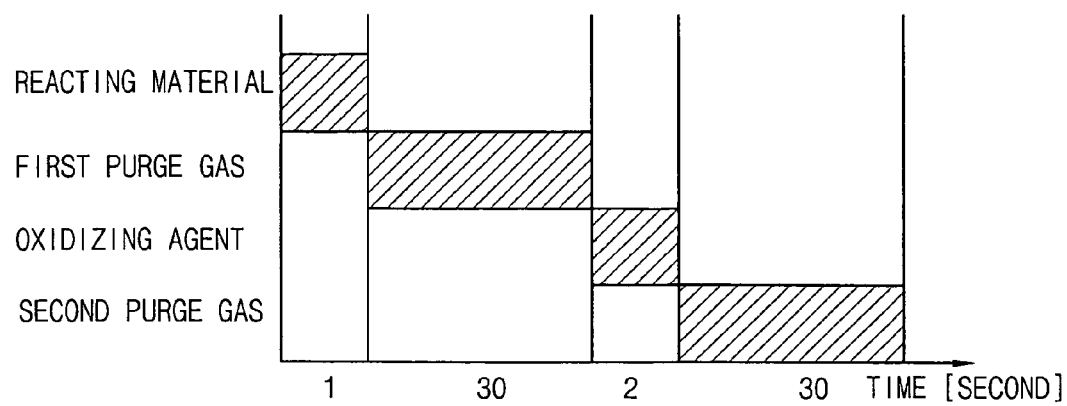
FIG. 4 is a timing sheet presenting feeding times of materials during formation of a thin film according to some embodiments of the present invention.

Referring to FIG. 4, a reactant was introduced into a chamber for about one second. The reactant included a mixture of zirconium butoxide ($Zr(OtBu)_4$) and titanium butoxide ($Ti(OtBu)_4$). A purge gas such as an argon (Ar) gas was then introduced for about 30 seconds and an oxidizing agent such as an ozone ($O_3$) gas was introduced for about 2 seconds. A purge gas such as the argon (Ar) gas was introduced for about 30 seconds. The chamber had a temperature of about 300° C. and a pressure of about 1.0 torr. Processes under conditions the same as, or similar to, those illustrated in FIG. 4 were carried out at least once to form the thin film. The thin film included zirconium titanium oxide in the single-layered structure and had a thickness of about 90 Å. The thin film had an equivalent oxide thickness (EOT) of about 9.7 Å.

The dielectric constant of the sample thin film obtained by using the above-described processes and conditions was calculated by the following equation 1.

$$Toxeq = (d \times \epsilon_{SiO2})/\epsilon_r \quad (1)$$

wherein:

Toxeq represents the equivalent oxide thickness (EOT) of the thin film;

d represents a thickness of the thin film;

$\epsilon_{SiO2}$ represents the dielectric constant of a silicon oxide layer; and $\epsilon_r$ represents the dielectric constant of the thin film.

In equation (1) above, 9.7 is substituted for the Toxeq, 90 is substituted for d and 3.9 is substituted for $\epsilon_{SiO2}$. Hence, a value of approximately 36.186 is obtained as a value of $\epsilon_r$. Thus, the sample thin film demonstrated a thickness of about 90 Å and a dielectric constant of about 36.186.

Therefore, the dielectric constant of the thin film in accordance with some embodiments of the present invention may be higher than that of a hafnium oxide layer or a zirconium oxide layer in accordance with conventional methods of forming a thin film.

Measurement of a Leakage Current

In order to measure leakage current characteristics of a capacitor having a thin film according to some embodiments of the present invention, a sample capacitor was prepared in accordance with methods according to some embodiments of the present invention as provided below.

A substrate having a lower electrode including ruthenium (Ru) was loaded into a chamber. The thin film was then formed on the lower electrode. The thin film was formed by the processes and the conditions as illustrated in FIG. 4. Specifically, a reactant was introduced into the chamber for about one second. The reactant included a mixture of zirconium butoxide ($Zr(OtBu)_4$) and titanium butoxide ($Ti(OtBu)_4$). TA purge gas such as argon (Ar) gas was then introduced for about 30 seconds and an oxidizing agent such as ozone ($O_3$) gas was introduced for about 2 seconds. The purge gas such as the argon (Ar) gas was introduced for about 30 seconds. The chamber had a temperature of about 300° C. and a pressure of about 1.0 torr. Processes under conditions the same as, or similar to, those illustrated in FIG. 4 were carried out at least once to form the thin film.

Consequently, a thin film including zirconium titanium oxide was formed on the single-layered structure. The thin film had a thickness of about 90 Å and an equivalent oxide thickness (EOT) of about 9.7 Å. Subsequently, an upper electrode including ruthenium (Ru) was formed on the thin film to form a capacitor.

Figure 5:
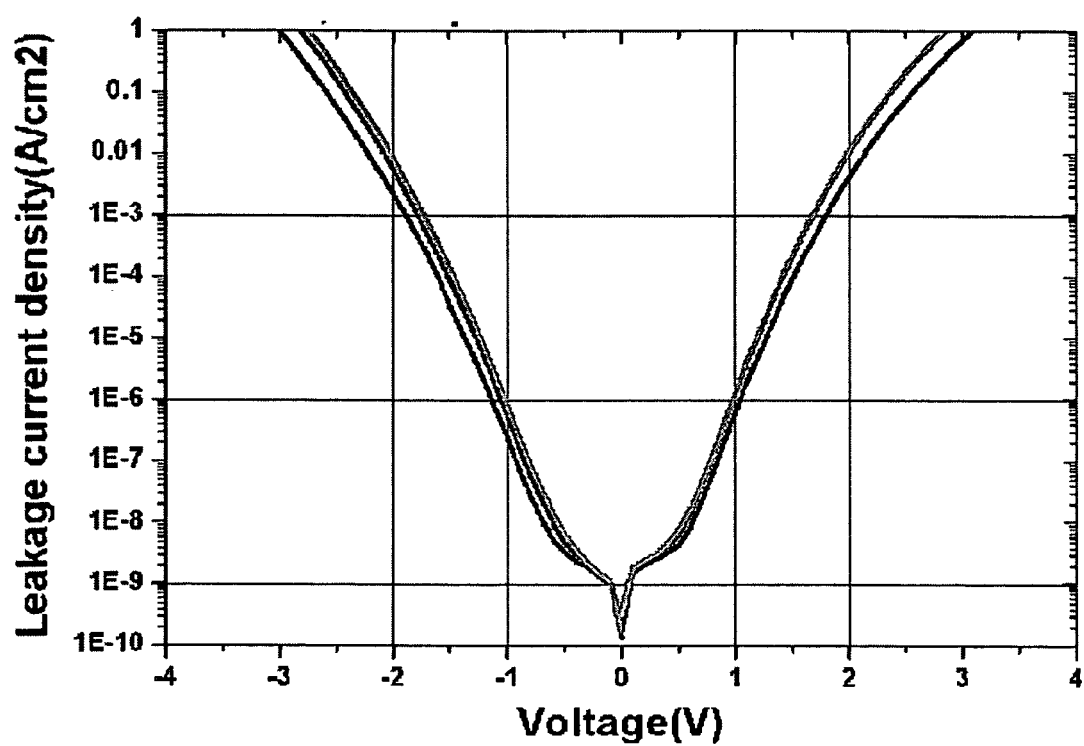
FIG. 5 is a graph illustrating a leakage current density of a capacitor including a thin film according to some embodiments of the present invention.
Figure 6:
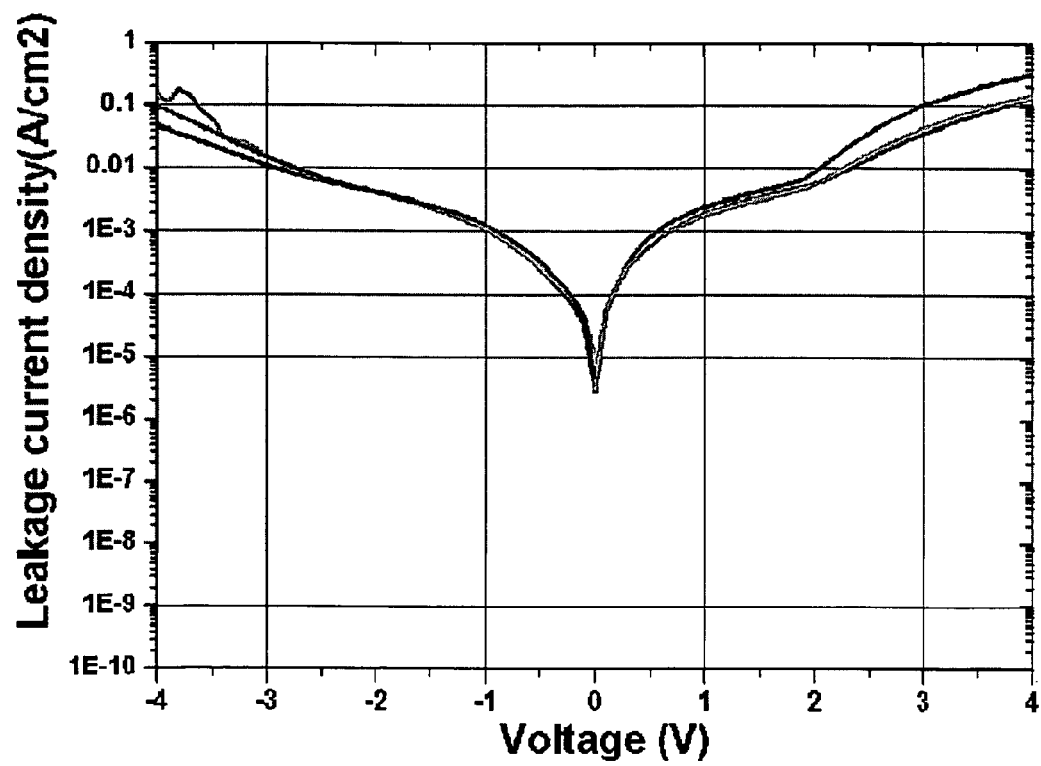
FIG. 6 is a graph illustrating a leakage current density of a capacitor including a conventional zirconium oxide layer.

The leakage current of the capacitor including the thin film was measured. FIG. 5 is a graph illustrating a leakage current density of the capacitor including the sample thin film. FIG. 6 is a graph illustrating a leakage current density of a capacitor having a conventional thin film including zirconium oxide. In FIGS. 5 and 6, the horizontal axis denotes a voltage applied to the capacitor and the vertical axis denotes a leakage current of the capacitor.

Referring to FIG. 5, the capacitor including the thin film showed a leakage current of about $10^{-7} A/cm^2$ at the applied voltage of about −1V to about 1V.

A titanium oxide layer having a thickness of 150 Å was formed in accordance with a conventional method. The leakage current of the capacitor including the titanium oxide layer was then measured. The titanium oxide layer had an equivalent oxide thickness (EOT) of about 9.7 Å. Referring to FIG. 6, the capacitor including the titanium oxide layer showed a leakage current of about $10^{-3} A/cm^2$ at the applied voltage of about −1V to about 1V.

The leakage current of the thin film in accordance with embodiments of the present invention may be reduced more than that of a hafnium oxide layer or a zirconium oxide layer formed in accordance with a conventional method.

Figure 7:
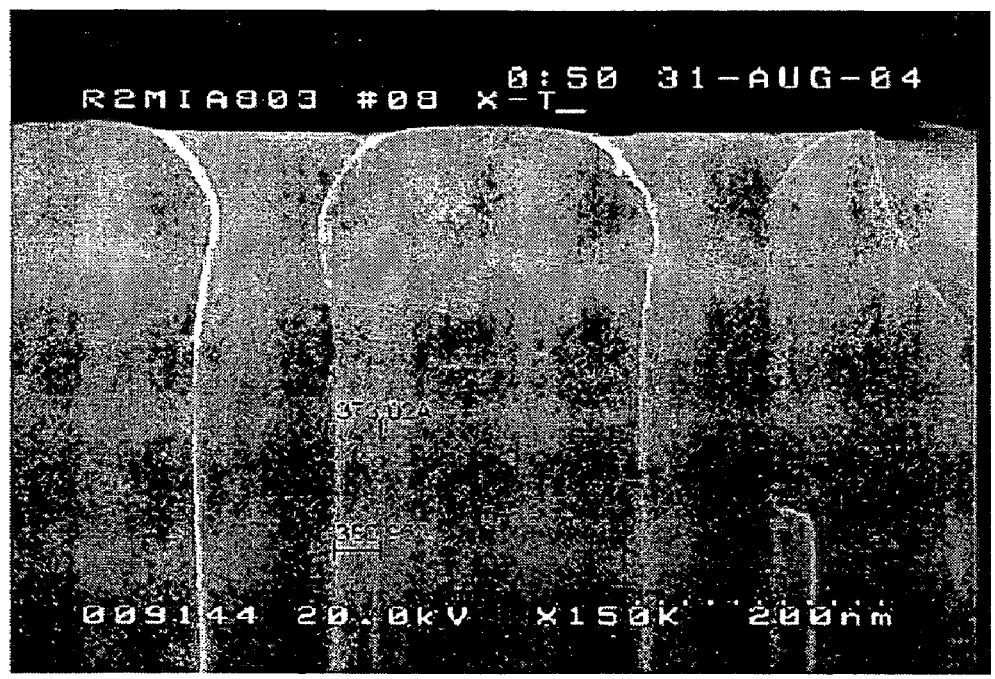
FIG. 7 is an electron microscopic picture illustrating the step coverage of a thin film according to some embodiments of the present invention.

Further, a step coverage of the thin film in accordance with embodiments of the present invention was measured. FIG. 7 is an electron microscopic picture illustrating the step coverage of the thin film in accordance with an example embodiment of the present invention. Referring specifically to FIG. 7, the thin film exhibited a step coverage of more than about 85%. Thus, the thin film in accordance with some embodiments of the present invention may have an improved step coverage compared to the step coverage of films formed using conventional methods.

According to some embodiments of the present invention, a thin film including zirconium titanium oxide having a single layer structure may be formed using a reactant including a mixture of a zirconium precursor and a titanium precursor. The thin film may have a high dielectric constant due, at least in part, to titanium oxide, and a leakage current of the thin film may be reduced due, at least in part, to zirconium oxide. The thin film including zirconium titanium oxide may be applied to a gate insulation layer of a gate structure, a dielectric layer of a capacitor or a flash memory device. The gate structure, the capacitor or the flash memory device having the thin film in accordance with some embodiments of the present invention may have improved electrical characteristics.

Many alterations and modifications may be made by those having ordinary skill in the art, given the benefit of present disclosure, without departing from the spirit and scope of the invention. Therefore, it must be understood that the illustrated embodiments have been set forth only for the purposes of example, and that it should not be taken as limiting the invention as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the invention.

What is claimed is:

1. A method of forming a thin film comprising:

introducing a reactant comprising a mixture of a zirconium precursor and a titanium precursor onto a substrate; and introducing an oxidizing agent onto the substrate to form a solid material including zirconium titanium oxide on the substrate, wherein forming the solid material comprises:

(a) introducing the reactant onto the substrate;
(b) chemisorbing a first portion of the reactant onto the substrate and physisorbing a second portion of the reactant onto the substrate;
(c) introducing the oxidizing agent onto the substrate;
(d) chemically reacting the first portion of the reactant with the oxidizing agent; and
(e) repeating (a) through (d) at least once.

2. The method of claim 1, wherein the reactant and the oxidizing agent are introduced simultaneously.

3. The method of claim 1, wherein the zirconium precursor comprises zirconium butoxide ($Zr(OtBu)_4$), tetrakis ethylmethylamino zirconium (TEMAZ; $Zr[N(CH_3)(C_2H_5)_4]$), zirconium ethoxide, ($Zr(OEt)_4$), zirconium iso-propoxide ($Zr(OC_3H_7)_4$) or tetramethyl heptanedionato zirconium ($Zr[TMHD]_4$; $Zr(C_{11}H_{19}O_2)_4$), and combinations thereof.

4. The method of claim 1, wherein the titanium precursor comprises titanium butoxide ($Ti(OtBu)_4$), tetrakis ethylmethylamino titanium (TEMAT; $Ti[N(CH_3)(C_2H_5)_4]$), titanium ethoxide ($Ti(OEt)_4$), titanium iso-propoxide ($Ti(OC_3H_7)_4$) or tetramethyl heptanedionato titanium ($Ti[TMHD]_2$; $Ti(C_{11}H_{19}O_2)_2$), and combinations thereof.

5. The method of claim 1, wherein a flow rate ratio between the zirconium precursor and the titanium precursor is in a range from about 1.0:0.3 to about 1.0:3.0.

6. The method of claim 1, wherein the oxidizing agent comprises an ozone ($O_3$) gas, an oxygen ($O_2$) gas, water vapor ($H_2O$), an oxygen ($O_2$) plasma or a remote oxygen ($O_2$) plasma, and combinations thereof.

7. The method of claim 1, wherein the thin film comprises a gate insulation layer.

8. The method of claim 1, wherein the thin film comprises a dielectric layer.

9. The method of claim 1, wherein the method is performed at a temperature in a range of about 250° C. to about 500° C.

10. The method of claim 1, wherein the method is performed at a pressure in a range of about 0.01 torr to about 10.0 torr.

11. The method of claim 1, further comprising:
removing the second portion of the reactant; and
removing unreacted oxidizing agent.

12. The method of claim 11, wherein the second portion of the reactant and the unreacted oxidizing agent are removed using a purge gas.

13. A method of forming a thin film comprising:
introducing a reactant comprising a mixture of a zirconium precursor and a titanium precursor onto the substrate, wherein a flow rate ratio between the zirconium precursor and the titanium precursor is in a range from about 1.0:0.3 to about 1.0:3.0; and
introducing an oxidizing agent onto the substrate to form a single layer structure including zirconium titanium oxide on the substrate, wherein forming the single layer structure comprises:
(a) introducing the reactant onto the substrate;
(b) chemisorbing a first portion of the reactant onto the substrate and physisorbing a second portion of the reactant onto the substrate;
(c) introducing the oxidizing agent onto the substrate;
(d) chemically reacting the first portion of the reactant with the oxidizing agent; and
(e) repeating (a) through (d) at least once.

14. A method of forming a gate structure in a semiconductor device comprising:
introducing a reactant comprising a mixture of a zirconium precursor and a titanium precursor onto a substrate and introducing an oxidizing agent onto the substrate to form a gate insulation layer including zirconium titanium oxide on the substrate;
forming a gate conductive layer on the gate insulation layer; and
patterning the gate conductive layer and the gate insulation layer to form a gate pattern comprising a gate conductive layer pattern and a gate insulation layer pattern,
wherein forming the gate insulation layer comprises:
introducing the reactant onto the substrate;
chemisorbing a first portion of the reactant onto the substrate and physisorbing a second portion of the reactant onto the substrate;
removing the second portion of the reactant;
providing the oxidizing agent onto the substrate;
forming a solid material comprising zirconium titanium oxide on the substrate by chemically reacting the first portion of the reactant with the oxidizing agent; and
removing an unreacted oxidizing agent.

15. The method of claim 14, wherein the zirconium precursor comprises zirconium butoxide ($Zr(OtBu)_4$), tetrakis ethylmethylamino zirconium (TEMAZ; $Zr[N(CH_3)(C_2H_5)_4]$), zirconium ethoxide, ($Zr(OEt)_4$), zirconium iso-propoxide ($Zr(OC_3H_7)_4$) or tetramethyl heptanedionato zirconium ($Zr[TMHD]_4$; $Zr(C_{11}H_{19}O_2)_4$), and combinations thereof, and the titanium precursor comprises titanium butoxide ($Ti(OtBu)_4$), tetrakis ethylmethylamino titanium (TEMAT; $Ti[N(CH_3)(C_2H_5)_4]$), titanium ethoxide ($Ti(OEt)_4$), titanium iso-propoxide ($Ti(OC_3H_7)_4$) or tetramethyl heptanedionato titanium ($Ti[TMHD]_2$; $Ti(C_{11}H_{19}O_2)_2$), and combinations thereof.

16. The method of claim 14, wherein a flow rate ratio between the zirconium precursor and the titanium precursor is in a range from about 1.0:0.3 to about 1.0:3.0.

17. The method of claim 14, wherein the oxidizing agent comprises an ozone ($O_3$) gas, an oxygen ($O_2$) gas, water vapor ($H_2O$), an oxygen ($O_2$) plasma or a remote oxygen ($O_2$) plasma, and combinations thereof.

18. The method of claim 14, wherein the solid material comprises a single layer structure.

19. The method of claim 14, wherein the method is performed at a temperature in a range of about 250° C. to 500° C. and under a pressure in a range of about 0.01 torr to about 10.0 torr.

20. The method of claim 14, wherein the method is repeated at least once.

21. A method of forming a capacitor in a semiconductor device comprising:
introducing a reactant comprising a mixture of a zirconium precursor and a titanium precursor onto a lower electrode and introducing an oxidizing agent onto the lower electrode to form a dielectric layer comprising zirconium titanium oxide; and
forming an upper electrode on the dielectric layer, wherein forming the dielectric layer comprises:
chemisorbing a first portion of the reactant onto the lower electrode and physisorbing a second portion of the reactant onto the lower electrode;
removing the second portion of the reactant;
introducing the oxidizing agent onto the lower electrode;
chemically reacting the first portion of the reactant with the oxidizing agent to form a solid material comprising zirconium titanium oxide on the lower electrode; and
removing unreacted oxidizing agent.

22. The method of claim 21, wherein the zirconium precursor comprises zirconium butoxide ($Zr(OtBu)_4$), tetrakis ethylmethylamino zirconium (TEMAZ; $Zr[N(CH_3)$ ($C_2H_5)_4$]), zirconium ethoxide, ($Zr(OEt)_4$), zirconium iso-propoxide ($Zr(OC_3H_7)_4$) or tetramethyl heptanedionato zirconium ($Zr[TMHD]_4$; $Zr(C_{11}H_{19}O_2)_4$), and combinations thereof, and the titanium precursor comprises titanium butoxide ($Ti(OtBu)_4$), tetrakis ethylmethylamino titanium (TEMAT; $Ti[N(CH_3)(C_2H_5)_4]$), titanium ethoxide ($Ti(OEt)_4$), titanium iso-propoxide ($Ti(OC_3H_7)_4$) or tetramethyl heptanedionato titanium ($Ti[TMHD]_2$; $Ti(C_{11}H_{19}O_2)_2$), and a combination thereof.

23. The method of claim 21, wherein a flow rate ratio between the zirconium precursor and the titanium precursor is in a range from about 1.0:0.3 to about 1.0:3.0.

24. The method of claim 21, wherein the oxidizing agent comprises an ozone ($O_3$) gas, an oxygen ($O_2$) gas, water vapor ($H_2O$), an oxygen ($O_2$) plasma or a remote oxygen ($O_2$) plasma, and combinations thereof.

25. The method of claim 21, wherein forming the method is performed at a temperature in a range from about 250° C. to 500° C. and under pressure in a range from about 0.01 torr to about 10.0 torr.

26. The method of claim 21, wherein the method is repeated at least once.

27. The method of claim 21, wherein the lower electrode comprises polysilicon, titanium nitride, tantalum nitride, tungsten nitride or ruthenium, and combinations thereof, and the upper electrode comprises polysilicon, titanium nitride, tantalum nitride, tungsten nitride or ruthenium, and combinations thereof.

28. A method of manufacturing a flash memory device comprising:

introducing a reactant comprising a mixture of a zirconium precursor and a titanium precursor onto a floating gate structure and introducing an oxidizing agent onto the floating gate structure to form a dielectric layer comprising zirconium titanium oxide on the floating gate structure; and forming a control gate on the dielectric layer, wherein forming the dielectric layer comprises:

chemisorbing a first portion of the reactant onto the floating gate structure and physisorbing a second portion of the reactant onto the floating gate structure;

removing the second portion of the reactant;

introducing the oxidizing agent onto the lower electrode;

chemically reacting the first portion of the reactant with the oxidizing agent to form a solid material comprising zirconium titanium oxide on the floating gate structure; and removing unreacted oxidizing agent.

29. The method of claim 28, wherein the zirconium precursor comprises zirconium butoxide ($Zr(OtBu)_4$), tetrakis ethylmethylamino zirconium (TEMAZ; $Zr[N(CH_3)(C_2H_5)_4]$), zirconium ethoxide, ($Zr(OEt)_4$), zirconium iso-propoxide ($Zr(OC_3H_7)_4$) or tetramethyl heptanedionato zirconium ($Zr[TMHD]_4$; $Zr(C_{11}H_{19}O_2)_4$), and combinations thereof, and the titanium precursor comprises titanium butoxide ($Ti(OtBu)_4$), tetrakis ethylmethylamino titanium (TEMAT; $Ti[N(CH_3)(C_2H_5)_4]$), titanium ethoxide ($Ti(OEt)_4$), titanium iso-propoxide ($Ti(OC_3H_7)_4$) or tetramethyl heptanedionato titanium ($Ti[TMHD]_2$; $Ti(C_{11}H_{19}O_2)_2$), and combinations thereof.

30. The method of claim 28, wherein a flow rate ratio between the zirconium precursor and the titanium precursor is in a range from about 1.0:0.3 to about 1.0:3.0.

31. The method of claim 28, wherein the oxidizing agent comprises ozone ($O_3$) gas, an oxygen ($O_2$) gas, water vapor ($H_2O$), an oxygen ($O_2$) plasma or a remote oxygen ($O_2$) plasma, and combinations thereof.

32. The method of claim 28, wherein forming the dielectric layer is performed at a temperature of about 250° C. to about 500° C. and under a pressure of about 0.01 torr to 10.0 torr.

33. The method of claim 28, wherein the method is repeated at least once.

34. The method of claim 28, wherein the floating gate comprises polysilicon, titanium nitride, tantalum nitride, tungsten nitride or ruthenium, and combinations thereof, and the control gate comprises polysilicon, titanium nitride, tantalum nitride, tungsten nitride or ruthenium, and combinations thereof.

* * * * *